(12) United States Patent
Kang et al.

(10) Patent No.: US 11,631,474 B2
(45) Date of Patent: Apr. 18, 2023

(54) REDUNDANCY ANALYSIS METHOD AND REDUNDANCY ANALYSIS APPARATUS

(71) Applicant: UIF (University Industry Foundation), Yonsei University, Seoul (KR)

(72) Inventors: Sung Ho Kang, Seoul (KR); Tae Hyun Kim, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 17/508,910

(22) Filed: Oct. 22, 2021

(65) Prior Publication Data

US 2022/0130486 A1 Apr. 28, 2022

(30) Foreign Application Priority Data

Oct. 23, 2020 (KR) ...................... 10-2020-013 8122

(51) Int. Cl.
*G11C 29/56* (2006.01)
*G11C 29/00* (2006.01)

(52) U.S. Cl.
CPC ...... *G11C 29/785* (2013.01); *G11C 29/56004* (2013.01); *G11C 29/56016* (2013.01); *G11C 29/702* (2013.01); *G11C 2029/5604* (2013.01)

(58) Field of Classification Search
CPC ............ G11C 29/785; G11C 29/56004; G11C 29/56016; G11C 29/702
See application file for complete search history.

(56) References Cited

U.S. PATENT DOCUMENTS 7,149,924 B1* 12/2006 Zorian ................... G11C 29/16
714/30
2020/0395093 A1* 12/2020 Kang ................. G11C 29/4401

FOREIGN PATENT DOCUMENTS

| KR | 20140065320 A | 5/2014 |
| KR | 102135470 B1 | 7/2020 |

OTHER PUBLICATIONS

Cenker, et al., Ronald P., "A Fault-Tolerant 64K Dynamic Random-Access Memory", IEEE Transactions On Electron Devices, Jun. 1979, vol. ED-26, No. 6, pp. 853-860.

* cited by examiner

*Primary Examiner* — Mohammed A Bashar
(74) *Attorney, Agent, or Firm* — Tarolli, Sundheim, Covell & Tummino LLP

(57) ABSTRACT

A redundancy analysis method of replacing a faulty part of a memory with at least one spare according to the present embodiment includes: acquiring fault information of the memory; and redundancy-allocating the fault with combinations of the spares to correspond to combination codes corresponding to the combinations of the spares, in which, the redundancy-allocating with the combination of the spare areas includes performing parallel processing on each combination of the spares.

16 Claims, 7 Drawing Sheets

| Number of Spares | | RM [5] | | B&B [6] | | FAST [8] | | VERA [9] | | FGPM [10] | | GRACE | |
|---|---|---|---|---|---|---|---|---|---|---|---|---|---|
| R | C | RA Latency ($\mu s$) | Normalized Repair Rate (%) | RA Latency ($\mu s$) | Normalized Repair Rate (%) | RA Latency ($\mu s$) | Normalized Repair Rate (%) | RA Latency ($\mu s$) | Normalized Repair Rate (%) | RA Latency ($\mu s$) | Normalized Repair Rate (%) | RA Latency ($\mu s$) | Normalized Repair Rate (%) |
| 7 | 7 | $5.98 \times 10^6$ | 62.96 | $2.70 \times 10^5$ | 100.00 | $8.59 \times 10^2$ | 70.37 | $1.89 \times 10^3$ | 100.00 | $8.83 \times 10^2$ | 100.00 | $3.76 \times 10^{-1}$ | 100.00 |
| 7 | 8 | $6.10 \times 10^6$ | 83.05 | $2.72 \times 10^5$ | 100.00 | $7.31 \times 10^2$ | 89.83 | $4.02 \times 10^3$ | 100.00 | $1.76 \times 10^3$ | 100.00 | $3.85 \times 10^{-1}$ | 100.00 |
| 8 | 7 | $6.13 \times 10^6$ | 88.14 | $2.82 \times 10^5$ | 100.00 | $7.67 \times 10^2$ | 91.53 | $4.11 \times 10^3$ | 100.00 | $1.74 \times 10^3$ | 100.00 | $3.83 \times 10^{-1}$ | 100.00 |
| 8 | 8 | $6.29 \times 10^6$ | 95.40 | $2.91 \times 10^5$ | 100.00 | $4.38 \times 10^2$ | 98.85 | $7.90 \times 10^3$ | 100.00 | $2.75 \times 10^3$ | 100.00 | $3.87 \times 10^{-1}$ | 100.00 |
| 8 | 9 | $6.33 \times 10^6$ | 98.94 | $3.09 \times 10^5$ | 100.00 | $2.78 \times 10^2$ | 100.00 | $1.30 \times 10^4$ | 100.00 | $3.76 \times 10^3$ | 100.00 | $4.00 \times 10^{-1}$ | 100.00 |
| 9 | 8 | $6.33 \times 10^6$ | 98.94 | $3.03 \times 10^5$ | 100.00 | $2.69 \times 10^2$ | 100.00 | $1.36 \times 10^4$ | 100.00 | $3.99 \times 10^3$ | 100.00 | $3.98 \times 10^{-1}$ | 100.00 |
| 9 | 9 | $6.46 \times 10^6$ | 98.99 | $3.16 \times 10^5$ | 100.00 | $4.64 \times 10^1$ | 100.00 | $1.85 \times 10^4$ | 100.00 | $5.32 \times 10^3$ | 100.00 | $4.03 \times 10^{-1}$ | 100.00 |

Fig. 6

| Number of Faults | RM [5] | | B&B [6] | | FAST [8] | | VIBRA [9] | | FGPM [10] | | GRACE | |
|---|---|---|---|---|---|---|---|---|---|---|---|---|
| | R.A Latency ($\mu s$) | Normalized Repair Rate (%) | R.A Latency ($\mu s$) | Normalized Repair Rate (%) | R.A Latency ($\mu s$) | Normalized Repair Rate (%) | R.A Latency ($\mu s$) | Normalized Repair Rate (%) | R.A Latency ($\mu s$) | Normalized Repair Rate (%) | R.A Latency ($\mu s$) | Normalized Repair Rate (%) |
| 21 | $6.71 \times 10^9$ | 100.00 | $3.56 \times 10^5$ | 100.00 | $9.24 \times 10^0$ | 100.00 | $3.34 \times 10^4$ | 100.00 | $7.14 \times 10^2$ | 100.00 | $4.30 \times 10^{-1}$ | 100.00 |
| 22 | $7.10 \times 10^9$ | 100.00 | $5.17 \times 10^5$ | 100.00 | $1.67 \times 10^1$ | 100.00 | $3.95 \times 10^4$ | 100.00 | $7.63 \times 10^3$ | 100.00 | $4.21 \times 10^{-1}$ | 100.00 |
| 23 | $7.57 \times 10^9$ | 99.89 | $8.45 \times 10^5$ | 100.00 | $1.74 \times 10^1$ | 100.00 | $4.24 \times 10^4$ | 100.00 | $9.59 \times 10^3$ | 100.00 | $3.93 \times 10^{-1}$ | 100.00 |
| 24 | $7.91 \times 10^9$ | 96.00 | $1.54 \times 10^6$ | 100.00 | $1.68 \times 10^2$ | 98.23 | $5.49 \times 10^4$ | 100.00 | $1.12 \times 10^4$ | 100.00 | $3.81 \times 10^{-1}$ | 100.00 |
| 25 | $8.44 \times 10^9$ | 83.85 | $2.38 \times 10^6$ | 100.00 | $2.98 \times 10^2$ | 91.99 | $5.94 \times 10^4$ | 100.00 | $1.19 \times 10^4$ | 100.00 | $4.14 \times 10^{-1}$ | 100.00 |
| 26 | $8.90 \times 10^9$ | 69.17 | $3.27 \times 10^6$ | 100.00 | $6.93 \times 10^2$ | 84.33 | $6.34 \times 10^4$ | 100.00 | $1.38 \times 10^4$ | 100.00 | $4.36 \times 10^{-1}$ | 100.00 |
| 27 | $9.44 \times 10^9$ | 59.23 | $6.59 \times 10^6$ | 100.00 | $2.17 \times 10^3$ | 77.68 | $6.70 \times 10^4$ | 100.00 | $1.50 \times 10^4$ | 100.00 | $3.92 \times 10^{-1}$ | 100.00 |
| 28 | $9.82 \times 10^9$ | 55.63 | $1.04 \times 10^7$ | 100.00 | $4.89 \times 10^3$ | 70.88 | $7.51 \times 10^4$ | 100.00 | $1.78 \times 10^4$ | 100.00 | $4.01 \times 10^{-1}$ | 100.00 |

Fig. 7

REDUNDANCY ANALYSIS METHOD AND REDUNDANCY ANALYSIS APPARATUS

CROSS-REFERENCE TO RELATED APPLICATION

This application claims priority to and the benefit of Korean Patent Application No. 10-2020-0138122, filed on Oct. 23, 2020, the disclosure of which is incorporated herein by reference in its entirety.

BACKGROUND

1. Field of the Invention

The present technology relates to a redundancy analysis method and a redundancy analysis apparatus.

2. Discussion of Related Art

As memory density and capacity increase, the probability of memory errors increases. To solve this problem, redundancy analysis, which is a method of replacing faulty cells by using redundancy memory cells in a memory, has been widely used.

Although various redundancy analysis methods have been proposed, the redundancy analysis methods still have disadvantages such as long redundancy analysis latency or low repair speed. In the existing redundancy analysis, the time taken to perform redundancy analysis on one commodity memory is less than 1 second, but since more than millions of all generated memories need to tested and repaired, a redundancy analysis latency of less than 1 second for a single memory also affects the overall memory production time. Therefore, when an optimal repair rate is not obtained, repairable memories may be discarded, which may lead to a decrease in memory production yield.

Meanwhile, recent computers include a plurality of cores capable of executing parallel threads and provide high parallel computing performance. Such parallel computing is widely used to improve the performance of application programs and simulations in various fields. As an apparatus including a plurality of cores capable of executing such parallel threads, a graphic processing unit (GPU) is generally used.

SUMMARY OF THE INVENTION

The redundancy analysis according to the related art takes a long time, and a large capacity storage space for storing a fault bitmap is required. The larger the number of test target memories at one time and the higher the probability of a memory error, the larger the storage space required to store error information. Therefore, an efficient redundancy analysis method is required to reduce the time consumed for the redundancy analysis and achieve the optimal repair rate.

One of the problems to be solved by the present technology is to solve the above-described difficulties of the related art. The present invention is directed to a redundancy analysis method and a redundancy analysis apparatus capable of reducing the time consumed for redundancy analysis and achieving an optimal repair rate.

According to an aspect of the present invention, there is provided a redundancy analysis method of replacing a faulty part of a memory with at least one spare, including: acquiring fault information of the memory; and redundancy-allocating a fault with combinations of the spares to correspond to combination codes corresponding to the combinations of the spares, in which, in the redundancy-allocating of the fault memory with the combination of a spare areas includes performing parallel processing on each combination of the spares.

The analysis method may be performed with a parallel computing device that executes a plurality of threads, and the redundancy allocation may be performed by executing each thread on each combination of the spare areas.

The memory may be in a form of an array including a plurality of rows and a plurality of columns, and the spare area may include a row spare that replaces a row of the memory, and a column spare that replaces a column of the memory.

The combination code may be a code in which a code corresponding to a row spare area and a code corresponding to a column spare area are arranged in an order of performing the redundancy allocation.

The acquiring of the fault information and the redundancy-allocating of the fault with the combination of the spare area may be performed a plurality of times.

The analysis method may count one or more of the number of spares used for the redundancy allocation and the number of available spares as the analysis method is performed a plurality of times.

When the number of spare areas counted in all combinations of the spares exceeds a predetermined value or the number of available spares is less than a predetermined value, the analysis method may be terminated.

The analysis method may output a combination with a small number of counted spare areas by a redundancy allocation method.

According to another aspect of the present invention, there is provided a redundancy analysis apparatus for replacing a faulty part of a memory with at least one spare, including: a communication unit configured to communicate with automatic test equipment (ATE) to receive fault information; and a parallel computing unit that includes a plurality of cores that execute a plurality of threads, in which the parallel computing unit may redundancy-allocate the fault of the memory with combinations of the spares to correspond to combination codes corresponding to the combinations of the spares, and perform the redundancy allocation by executing the threads on each combination of the spares.

The fault information may include a fault address of the memory.

The memory may be in a form of an array including a plurality of rows and a plurality of columns, and the spare may include a row spare that replaces a row of the memory, and a column spare that replaces a column of the memory.

The combination code may be a code in which a code corresponding to the row spare and a code corresponding to the column spare are arranged in an order of performing the redundancy allocation.

The analysis device may receive fault information a plurality of times from the ATE, and the redundancy allocation may be performed a plurality of times with the combination of the spares whenever the fault information is received.

The analysis apparatus may count the number of spares used for the redundancy allocation and the number of available spares whenever the fault is redundancy-allocated with the combination of the spares.

The analysis apparatus may communicate with the ATE to terminate the analysis method in any one of a case where the counted number of spares exceeds a predetermined value and a case where the counted number of available spares is less than the predetermined value.

The analysis device may output a combination with a small number of counted spares to the ATE.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 6 is a diagram illustrating an analysis time of the RA and a normalized repair rate according to the number of spare parts; and FIG. 7 is a diagram illustrating an analysis time of the normalized repair rate.

DETAILED DESCRIPTION OF EXEMPLARY EMBODIMENTS

Figure 1:
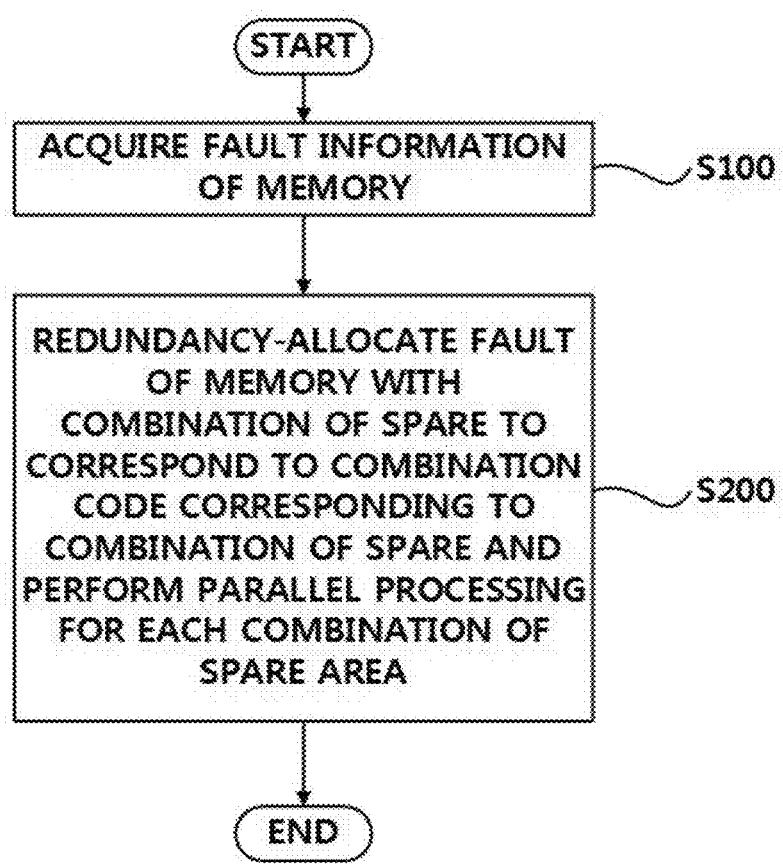
FIG. 1 is a flowchart illustrating an outline of a redundancy analysis method according to the present embodiment.
Figure 2:
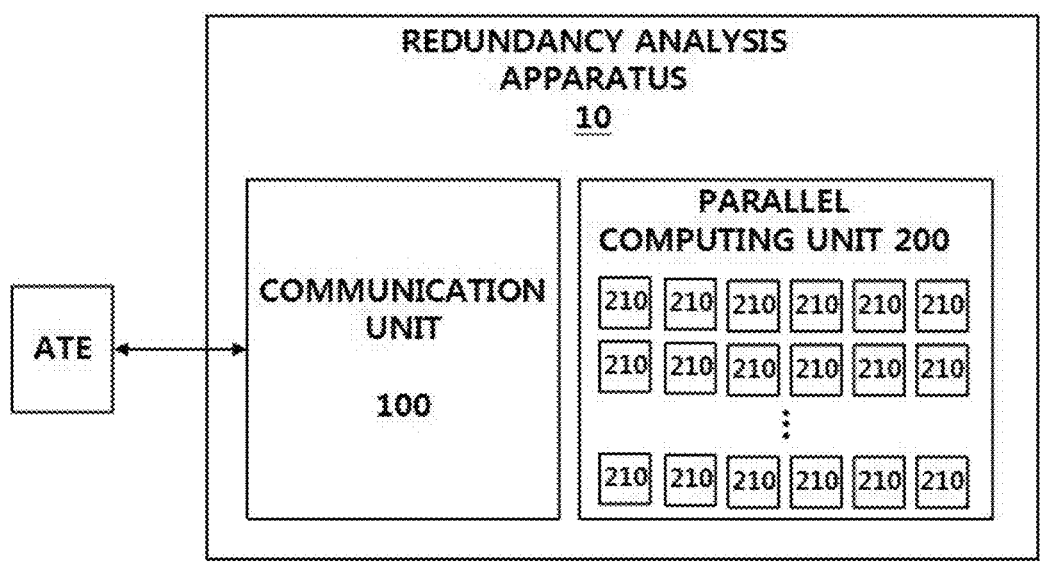
FIG. 2 is a block diagram schematically illustrating a redundancy analysis apparatus according to the present embodiment.

Hereinafter, a redundancy analysis method and a redundancy analysis apparatus according to the present embodiment will be described with reference to the accompanying drawings. FIG. 1 is a flowchart schematically illustrating an outline of a redundancy analysis method according to the present embodiment, and FIG. 2 is a block diagram schematically illustrating an outline of a redundancy analysis apparatus according to the present embodiment. Referring to FIGS. 1 and 2, the redundancy analysis method according to the present embodiment includes acquiring fault information of a memory (S100), and redundancy-allocating a fault of the memory with combinations of spares to correspond to a combination code corresponding to the combinations of the spares (S200), in which, in the redundancy-allocating to the combination of the spares, parallel processing is performed for each combination of the spares.

An redundancy analysis apparatus 10 according to the present embodiment includes a communication unit 100 that communicates with automatic test equipment (ATE) for testing a memory to receive fault information, and a parallel computing unit 200 that includes a plurality of cores 210 executing a plurality of threads, in which the parallel computing unit 200 redundancy-allocates the fault of the memory with a combination of spare areas to correspond to a combination code corresponding to combinations of spare areas and performs the redundancy allocation by executing each thread on each combination of spare areas.

The parallel computing unit 200 includes a plurality of cores 210 and may process a plurality of computational threads in parallel by using these cores 210. The automatic test equipment (ATE) tests a large number of memories simultaneously and, therefore, needs to process a large amount of fault information obtained from each target memory. As in the present embodiment, an efficient redundancy analysis may be performed using the parallel computing unit 200 capable of performing a parallel operation. In one embodiment, the parallel computing unit 200 may be a graphic processing unit (GPU) including the plurality of cores 210. In another embodiment, the parallel computing unit 200 may be a plurality of central processing units (CPUs).

The communication unit 100 communicates with the ATE for testing the memory to transmit and receive data required for redundancy analysis. The ATE transmits fault information to the redundancy analysis apparatus 10 when a fault is found in a test target memory. The redundancy analysis apparatus 10 transmits a redundancy analysis result to the ATE when the parallel computing unit 200 is in an idle state.

In an embodiment, data for communication between the ATE and the communication unit 100 includes fault information, a redundancy analysis state, and a redundancy analysis result. The fault information includes the number of faulty memories among the test target memories and addresses of faulty rows and columns in the memories. The redundancy analysis status includes how to repair the fault by the redundancy allocation, the number of remaining spares, and addresses of repaired rows or columns. The redundancy result data may include the total number of remaining spares after the repair and the repair status. In an embodiment, the communication unit 100 may further include a buffer (not illustrated) for temporarily storing data transmitted and received to and from the ATE.

Since the parallel computing unit 200 may perform many calculations through parallel computing, all instances of the redundancy allocation may be simultaneously tested whenever a new fault is detected without storing the fault information, thereby dynamically analyzing the fault.

A fault bitmap essential for static or hybrid redundancy analysis essential in the related art is not required in the present embodiment. In addition, since the redundancy analysis is performed when the fault is detected, there is no need for an additional analysis time after a test sequence is completed. Furthermore, according to the present embodiment, since instances of all possible duplicate allocation cases may be tested, a repair rate is improved as compared to the related art.

Figure 3:
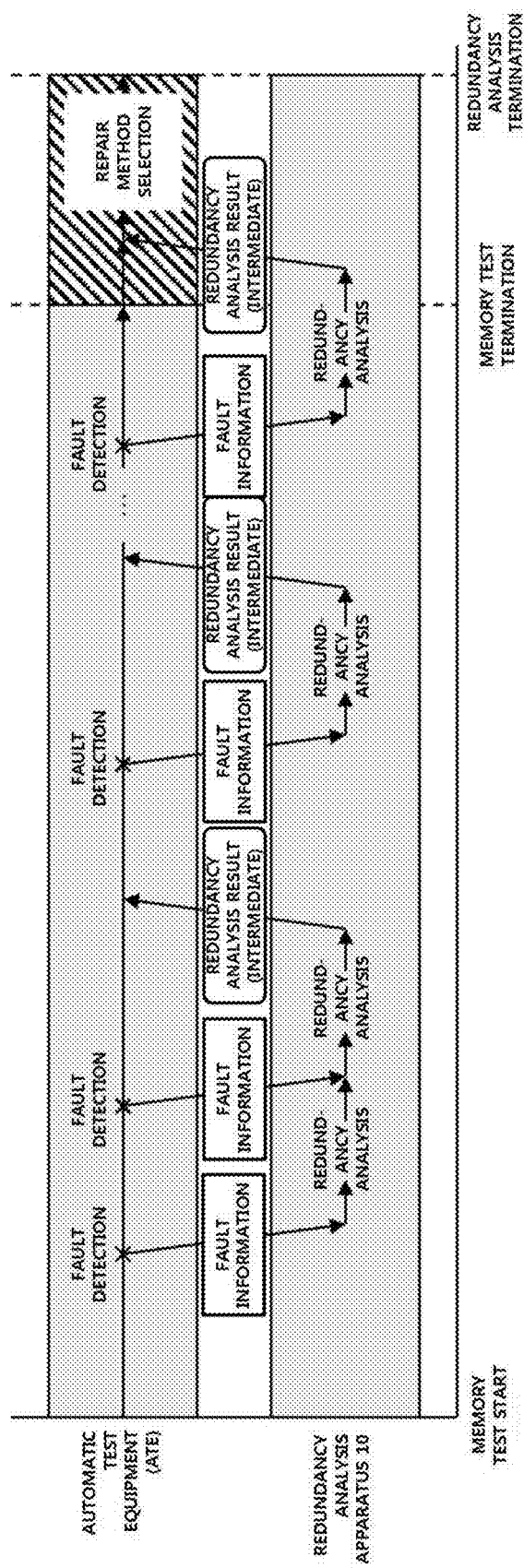
FIG. 3 is a diagram schematically illustrating a process in which a memory test and redundancy analysis (RA) are performed in automatic test equipment (ATE) and the redundancy analysis apparatus.

FIG. 3 is a diagram schematically illustrating a process in which the memory test and the RA are performed in the ATE and the redundancy analysis apparatus 10. Referring to FIG. 3, the memory test starts after the test target memory is mounted in the ATE. When the fault is detected by testing the test target memory, the ATE forms the fault information and provides the formed fault information to the redundancy analysis apparatus 10.

The redundancy analysis apparatus 10 performs redundancy analysis upon receiving the fault information. The redundancy analysis result may be stored in a buffer (not illustrated), and when the redundancy analysis apparatus 10 is in an idle state, an intermediate result of the redundancy analysis is output to the ATE. Subsequently, when the ATE detects a new fault and provides fault information, the redundancy analysis apparatus 10 performs the redundancy analysis, including the new fault, and transmits an intermediate result to the ATE.

After the memory test is terminated, the ATE repairs the memory fault by selecting an optimal method capable of repairing a memory fault from the input redundancy analysis result. For example, the ATE may repair a memory fault by selecting a repair method having the smallest number of spares. According to another embodiment not illustrated, when the faults identified by the memory test result cannot be repaired with a given number of row spares and column spares, the redundancy analysis may be prematurely terminated without performing the redundancy analysis.

In the related art, when the memory test is completed, the ATE forms fault information and provides the fault information to the redundancy analysis apparatus 10 to perform the redundancy analysis. In this case, since the redundancy analysis is performed only after the memory test, the time it takes to complete the memory test and redundancy analysis increases. In addition, a large-capacity storage device is required to store a fault bitmap that is the memory test result.

However, according to the present embodiment, since the redundancy analysis is performed while the memory test is performed, it is possible to reduce the time taken from the start of the memory test to the completion of the redundancy analysis, and since there is no need to store all the fault information, it is possible to reduce the capacity of the storage device.

Figure 4:
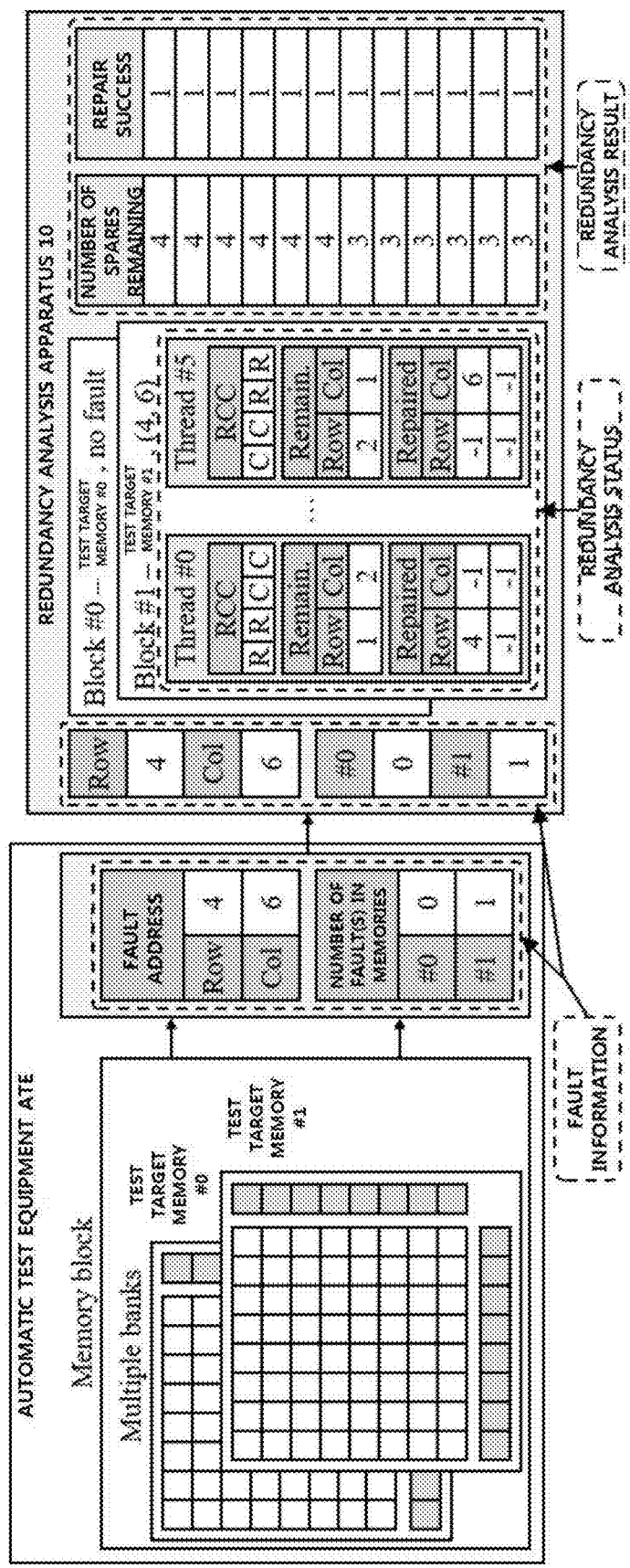
FIG. 4 is a diagram schematically illustrating operations of the ATE and the redundancy analysis apparatus.

FIG. 4 is a diagram schematically illustrating operations of the ATE and the redundancy analysis apparatus 10. Referring to FIG. 4, the ATE may test one or more test target memories. FIG. 4 illustrates an example of testing two memories, test target memory #0 and test target memory #1. FIG. 4 illustrates an example in which test target memories have two row spares and two column spares, respectively.

When the test starts, the ATE transmits a test pattern including a memory address and data to the test target memory and receives data from the test target memory. The data received from the test target memory is compared with the data transmitted by the ATE to the test target memory, and the ATE detects a fault.

When the ATE detects a fault in the test target memory #1 while checking the response of the test target memory #1, the ATE generates fault address information indicating rows and columns at fault locations. The ATE generates a faulty test target memory among the test target memories and information on the number of faults indicating the number of faults and transmits fault information including the generated faulty test memory and the information on the number of faults to the redundancy analysis apparatus 10.

FIG. 4 illustrates an example in which the ATE does not find a fault in the test target memory #0, but finds one fault in the test target memory #1. The ATE sets a value of 0 to the test target memory #0 and a value of 1 to the test target memory #1 as the information on the number of faults in the memory. In addition, the ATE sets "Row 4, Col 6", which are addresses of the fault detected in the test target memory #1, and transmits the set "Row 3, Col 6" to the redundancy analysis apparatus 10.

The redundancy analysis for each test target memory is performed based on the fault information provided by the ATE. In the example illustrated in FIG. 4, the redundancy analysis for one test target memory is performed in one block. A plurality of threads may be allocated with each block, and the number of allocated threads is equal to the number of possible repair cases because one repair case is checked on one thread.

When the redundancy analysis apparatus 10 is driven and initialized, a space for storing the redundancy analysis state is allocated with a global memory (not illustrated) in advance. When the redundancy analysis apparatus 10 is initialized, the repaired row address Row and column address Col are initialized to −1 and −1, respectively. No redundancy analysis is performed on block #0 because no fault was found in the test target memory #0. In block #1, the redundancy analysis is performed on all allocated threads, and the redundancy analysis state is stored.

Referring to the redundancy analysis state, in thread #0 executed in block #1, the fault is repaired with a row spare. Accordingly, the number of remaining row spares (Row) is reduced to 1, and row addresses 4 and −1 including the repaired row address (Row) 4 are stored. Similarly, in thread #5, the fault is repaired with a column spare. Accordingly, the number of remaining column spares (Col) is reduced to 1, and column addresses −1 and 6 including the repaired column address (Col) 6 are stored.

Referring to the redundancy analysis results, in the illustrated example, no faults are found in the test target memory #0, and thus, the redundancy analysis is not performed on block #0. Therefore, a spare is not used, and 4 is stored as the number of remaining spares as a result of the redundancy analysis performed in block #0. However, since one spare is used in all the threads according to a result of the redundancy analysis performed in block #1, 3 is stored as the number of remaining spares as a result of the redundancy analysis performed in block #1. By storing 1 in repair success, all threads indicate repair success in fault repair. When the redundancy analysis is completed and the redundancy analysis apparatus is in the idle state, the redundancy analysis result is transmitted to the ATE.

Figure 5:
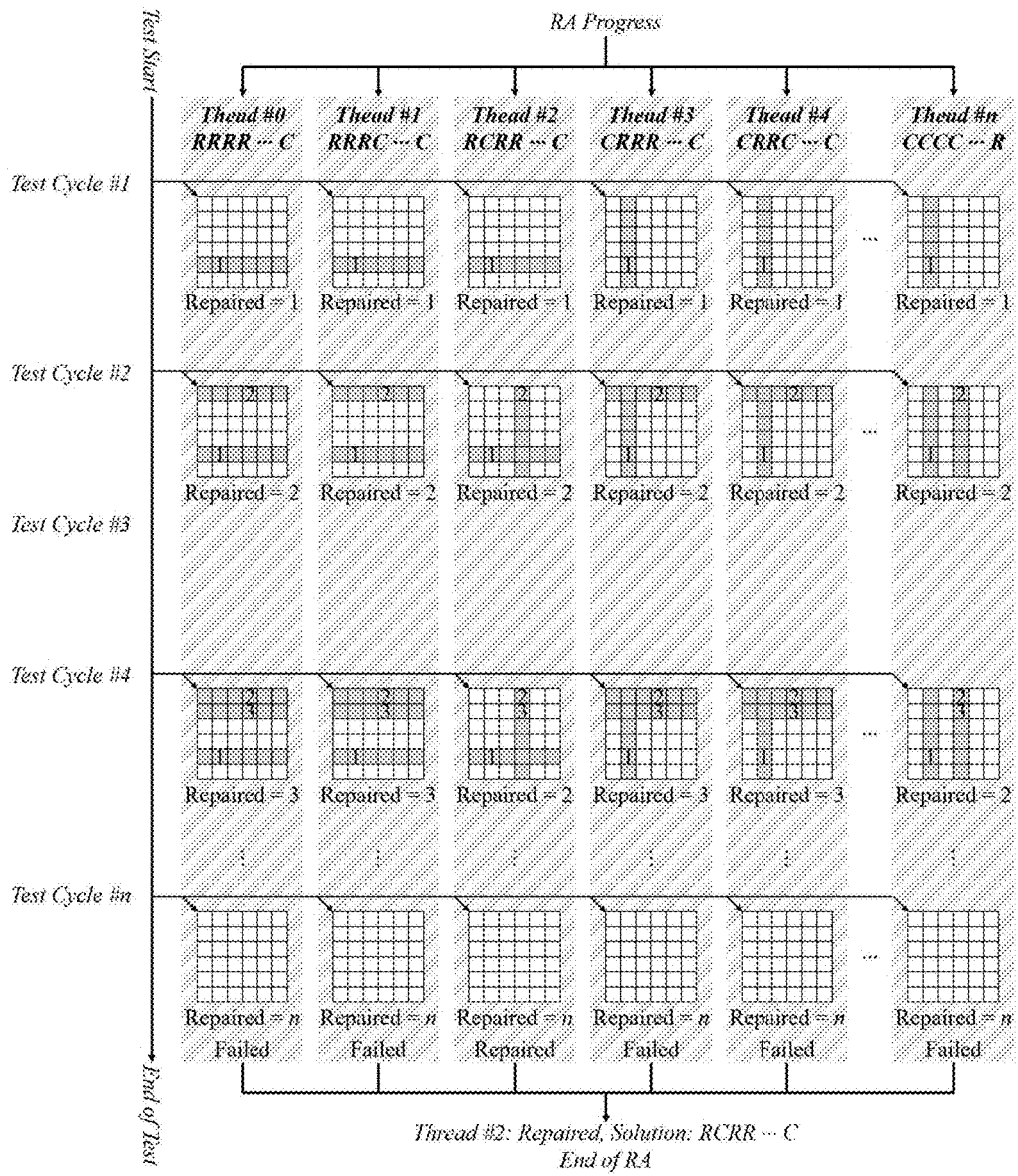
FIG. 5 is a diagram schematically illustrating a process in which a parallel computing unit performs the RA from fault information.

FIG. 5 is a diagram schematically illustrating a process in which the parallel computing unit 200 performs the redundancy analysis from the fault information. In the embodiment illustrated in FIG. 5, the redundancy analysis is performed in parallel with a total of 6 threads from Thread #0 to Thread #5. However, the number of threads performing the redundancy analysis is for concise and clear explanation and does not limit the scope of the present invention.

A combination code corresponding to a combination of spare areas is set for each thread. As an embodiment, it is exemplified that four row spares and four column spares are formed in the test target memory, and the combination code allocated with each thread indicates an allocation order of each spare. In the illustrated embodiment, Thread #0 is allocated a combination code of RRRR . . . C, which indicates that first to fourth faults first found in the memory are allocated with row spares, and the fault last found in the memory is allocated with a column spare. Similarly, Thread #3 is given a combination code of CRRR . . . C, which indicates that the fault first found in the memory is allocated with a column spare, and the second to fourth faults found in the memory are allocated with row spares. As described above, a combination code is allocated with each of all the cases where the redundancy allocation may be performed using four row spares and four column spares, and the redundancy analysis is performed on each of these cases by a separate thread.

In the example illustrated in FIG. 5, the redundancy allocation is performed according to the fault information and combination code in the memory from the ATE in test cycle #1. For the sake of illustration, the fault location of the memory is marked with a 1 in the memory array. The combination code of Thread #0 is RRRR . . . C, and the first fault is allocated with a row spare. The combination code of Thread #3 is CRRR . . . C, and therefore, the first fault is allocated with a column spare. The redundancy allocation process of allocating the fault with a spare is performed in parallel in each thread. The number of spare areas (repaired) allocated with the fault found in test cycle #1 is set to 1.

In test cycle #2, a subsequent test is performed on the test target memory, and faults 1 and 2 are found. The ATE provides these faults as the fault information to the redundancy analysis apparatus 10. Each thread executed in the redundancy analysis apparatus 10 performs the redundancy allocation with a combination code set for the fault corresponding to the provided fault information. In test cycle #2, Thread #1 performs the redundancy allocation with row spares for the first and second faults, and Thread #3 performs the redundancy allocation with a column spare and a row spare for the first and second faults. In test cycle #2, the number of row spares and the number of column spares required to perform the redundancy allocation are two, which is set as the number of spares required (Repaired).

In test cycle #3, the ATE performed a test on the test target memory, but does not detect any faults. In this case, each thread may not operate, and the redundancy analysis result in test cycles #1 and #2 (refer to FIG. 3) may be transmitted to the ATE.

In test cycle #4, the test by the ATE is performed to detect faults 1, 2 and 3 and provides the fault information to the redundancy analysis apparatus 10. Each thread executed in the redundancy analysis apparatus 10 performs redundancy allocation for the provided fault information and the set combination code. Thread #1 performs the redundancy allocation of the faults 1, 2, and 3 with the row spares and performs the redundancy allocation using a total of three spare areas. However, Thread #2 may perform the redundancy allocation with a row spare for the fault 1 but may perform the redundancy allocation with one column spare for the faults 2 and 3. Accordingly, the number of spare areas (Repaired) required when the redundancy is allocated with the faults 1, 2, and 3 by Thread #2 is set to 2.

As the memory test process proceeds, the redundancy allocation is performed by allocating the row spares and the column spares to the faults found in the test target memory, and the number of spares used in the redundancy allocation is updated. In test cycle #n, which is the last memory test process, the number of spare areas required (Repaired) and the number of available spare areas are compared when allocating redundancy to resolve all faults, and it is determined whether the memory can be repaired or not for each thread. In the illustrated example, Thread #2 may repair a fault found during a test, and in this case, the faults of the memory may be repaired by being redundancy-allocated with spares of RCRR . . . C.

Experimental Example

The redundancy analysis method and the redundancy analysis apparatus according to the present embodiment need to be performed together with a memory test. For the memory test, a Polya-Eggenberger distribution model similar to the failure distribution of a real memory was used. In order to measure the performance of the present embodiment, a simulator and a 1024*1024 memory for the redundancy analysis method of the present embodiment and the related art were common to all experiments. Each experiment per fault distribution was performed 1,000 times, and the average value was calculated for fair comparison.

The experiment on the redundancy analysis method of the related art was performed using a 3.2 GHz CPU, an NVIDIA Pascal Architecture GPU was used to implement the present embodiment, and an NVIDIA CUDA library was used for programming the GPU.

The present embodiment and the related art were evaluated in terms of redundancy analysis performance and hardware overhead, and in order to evaluate the redundancy analysis performance of the present embodiment, the latency and normalized repair rate were measured, and the hardware overhead and cost required to implement the related art were estimated compared to the related art.

In the present embodiment, the analysis time and repair rate were evaluated according to the number of spares along with five other redundancy analysis methods. The memory size was fixed at 1,024 rows and columns, and the number of errors was set to 21, which is larger than the maximum number of spares to evaluate the normalized repair rate.

In most cases, since the test and the redundancy analysis are performed simultaneously, only the time required to confirm the redundancy analysis result after the memory test is considered as the redundancy analysis latency. However, when errors are found at the end of the test, the analysis time for the last error and the time to copy the RA result from the device to the host are taken into account. The experiment is repeated 1,000 times, and the analysis time is the average time taken to complete the redundancy analysis after the last test iteration.

FIG. 6 is a diagram illustrating the analysis time of the RA and the normalized repair rate according to the number of spare parts. The present embodiment showed the shortest redundancy analysis latency among the evaluated methods. Since the number of repair cases increased according to the number of spares, the redundancy analysis latency of the present embodiment increased in proportion to the number of spares. When the number of spares is small, the normalized repair rates of RM and FAST of the related art decreased, while the B&B, VERA, and FGPM of the related art maintained a normalized repair rate of 100%. The present embodiment maintained a normalized repair rate of 100%.

Experiments with different numbers of errors were performed on memories with 10 row spares and 10 column spares. FIG. 7 is a diagram illustrating the analysis time of the normalized repair rate. Compared with the conventional redundancy analysis techniques such as B&B, VERA, and FPGM, the present embodiment showed the highest redundancy analysis rate and almost constant latency regardless of the number of errors. As expected, even when the number of failures increases, the present embodiment maintained a normalized repair rate of 100.00%, but it can be seen that the normalized repair rate is decreased in the RM and FAST of the related art.

In the present embodiment, the redundancy analysis is performed when the fault is detected in the memory tester, and therefore, additional analysis time is not required after the test sequence is completed. Furthermore, according to the present embodiment, since all possible duplicate allocation cases may be tested, the repair rate is improved as compared to the related art. Further, as illustrated, the advantage of providing a high repair rate is provided.

According to the present embodiment, it is possible to reduce redundancy analysis latency, and obtain a high repair rate.

Although the present invention has been described with reference to embodiments illustrated in the accompanying drawings in order to help the understanding of the present invention, this is only an exemplary embodiment for implementation, and those of ordinary skill in the art will understand that various modifications and equivalent other embodiments are possible therefrom. Accordingly, the true technical scope of the present invention is to be determined by the spirit of the appended claims.

What is claimed is:

1. A redundancy analysis method of replacing a faulty part of a memory with at least one spare, the redundancy analysis method comprising:

acquiring fault information of the memory; and redundancy-allocating a fault with combinations of the spares to correspond to combination codes corresponding to the combinations of the spares, wherein in the redundancy-allocating of the fault with the combination of a spare areas includes performing parallel processing on each combination of the spares, wherein the redundancy-allocating is performed in a plurality of threads in a parallel manner, each of the plurality of threads is performed according to the combination of the spares assigned to each of the plurality of threads, and wherein the combinations assigned to the plurality of threads correspond to all combinations of spares available.

2. The redundancy analysis method of claim 1, wherein the analysis method is performed with a parallel computing device that executes the plurality of threads, and the redundancy allocation is performed by executing each thread on each combination of the spare areas.

3. The redundancy analysis method of claim 1, wherein the memory is in a form of an array including a plurality of rows and a plurality of columns, and the spare area includes a row spare that replaces a row of the memory, and a column spare that replaces a column of the memory.

4. The redundancy analysis method of claim 3, wherein the combination code is a code in which a code corresponding to a row spare area and a code corresponding to a column spare area are arranged in an order of performing the redundancy allocation.

5. The redundancy analysis method of claim 1, wherein the acquiring of the fault information and the redundancy-allocating of the fault with the combination of the spare area are performed a plurality of times.

6. The redundancy analysis method of claim 5, wherein the analysis method counts one or more of the number of spares used for the redundancy allocation and the number of available spares as the analysis method is performed a plurality of times.

7. The redundancy analysis method of claim 4, wherein, when the number of spare areas counted in all combinations of the spares exceeds a predetermined value or the number of available spares is less than a predetermined value, the analysis method is terminated.

8. The redundancy analysis method of claim 7, wherein the analysis method outputs a combination with a small number of counted spare areas by a redundancy allocation method.

9. A redundancy analysis apparatus for replacing a faulty part of a memory with at least one spare, the redundancy analysis apparatus comprising:

a communication unit configured to communicate with automatic test equipment (ATE) to receive fault information; and a parallel computing unit that includes a plurality of cores that execute a plurality of threads in a parallel manner, wherein the parallel computing unit redundancy-allocates the fault of the memory with combinations of the spares to correspond to combination codes corresponding to the combinations of the spares and performs the redundancy allocation by executing the threads on each combination of the spares, wherein each of the plurality of threads is performed according to the combination of the spares assigned to each of the plurality of threads, and wherein the combinations assigned to the plurality of threads correspond to all combinations of spares available.

10. The redundancy analysis apparatus of claim 9, wherein the fault information includes a fault address of the memory.

11. The redundancy analysis apparatus of claim 9, wherein the memory is in a form of an array including a plurality of rows and a plurality of columns, and the spare includes a row spare that replaces a row of the memory, and a column spare that replaces a column of the memory.

12. The redundancy analysis apparatus of claim 11, wherein the combination code is a code in which a code corresponding to the row spare and a code corresponding to the column spare are arranged in an order of performing the redundancy allocation.

13. The redundancy analysis apparatus of claim 9, wherein the analysis device receives fault information a plurality of times from the ATE, and the redundancy allocation is performed a plurality of times with the combination of the spares whenever the fault information is received.

14. The redundancy analysis apparatus of claim 13, wherein the analysis apparatus counts the number of spares used for the redundancy allocation and the number of available spares whenever the fault is redundancy-allocated with the combination of the spares.

15. The redundancy analysis apparatus of claim 14, wherein the analysis apparatus communicates with the ATE to terminate the analysis method in any one of a case where the counted number of spares exceeds a predetermined value and a case where the counted number of available spares is less than a predetermined value.

16. The redundancy analysis apparatus of claim 14, wherein the analysis device outputs a combination with a small number of counted spares to the ATE.

* * * * *